(12) United States Patent
Nagakubo et al.

(10) Patent No.: US 7,700,927 B2
(45) Date of Patent: Apr. 20, 2010

(54) HEATING STAGE FOR A MICRO-SAMPLE

(75) Inventors: Yasuhira Nagakubo, Hitahinaka (JP); Toshiaki Tanigaki, Hitahinaka (JP); Katsuji Itou, Hitahinaka (JP); Takashi Kanemura, Hitahinaka (JP); Takayuki Asakawa, Hitahinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 145 days.

(21) Appl. No.: 12/123,168

(22) Filed: May 19, 2008

(65) Prior Publication Data

US 2008/0290290 A1 Nov. 27, 2008

(30) Foreign Application Priority Data

May 21, 2007 (JP) .............................. 2007-134507

(51) Int. Cl.
*H01J 37/20* (2006.01)
(52) U.S. Cl. ................................ 250/443.1; 250/442.11
(58) Field of Classification Search .............. 250/443.1, 250/442.11, 311
See application file for complete search history.

(56) References Cited

U.S. PATENT DOCUMENTS 5,367,171 A * 11/1994 Aoyama et al. .......... 250/443.1
7,566,884 B2 * 7/2009 Deguchi et al. ........ 250/442.11

FOREIGN PATENT DOCUMENTS

| JP | 05-052721 | 3/1993 |
| JP | 06-044936 | 2/1994 |
| JP | 2774884 | 7/1998 |
| JP | 2000-040483 | 2/2000 |
| JP | 3663056 | 6/2005 |

* cited by examiner

*Primary Examiner*—Kiet T Nguyen
(74) *Attorney, Agent, or Firm*—McDermott Will & Emery LLP (57) ABSTRACT

The present invention achieves a heating stage for a micro-sample, capable of efficient heating and accurate observation of the micro-sample. A micro-sample mount is a heating portion in coil form and is fixed at both ends to a base for the heating stage for the micro-sample. The base can be divided into two members at a base cut line, and the mount is fixed at one end to the first member and is fixed at the other end to the second member. A sample subjected to micro-sampling is mounted on the mount. The base is removed from the tip of a holder, and is mounted on a stage for the sample stage. A current is fed to the micro-sample mount through the members to thereby apply heat to a micro-sample for observation.

14 Claims, 8 Drawing Sheets

IMAGE OF MICRO-SAMPLE IN ITS MOUNTED POSITION

FIG. 9

IMAGE OF MICRO-SAMPLE BEFORE HEATING (AT ROOM TEMPERATURE)

FIG. 10

IMAGE OF MICRO-SAMPLE AS HEATED (at 500°C)

FIG. 11

IMAGE OF MICRO-SAMPLE AS HEATED (at 640°C)

FIG. 12

IMAGE OF MICRO-SAMPLE AS HEATED (at 700°C)

FIG. 13

IMAGE OF MICRO-SAMPLE AS HEATED (at 800°C)

HEATING STAGE FOR A MICRO-SAMPLE

BACKGROUND OF THE INVENTION

1. Field of the Invention

The present invention relates to a heating stage for a micro-sample, which is used for efficient heating and observation of a sample as subjected to a micro-sampling process by an instrument for observation based on a focused ion beam process.

2. Description of the Related Art

The heating and observation of a powder sample, when performed for the heating and observation of a given micro-sample, involves fixing the powder sample directly on a coil heater for heating, thereby carrying out the heating and observation.

This is an effective means for the heating and observation of the powder sample because the heater also serves as a part for fixing the powder sample and thus the sample is directly heated and hence affected little by removal of heat in an atmosphere of vacuum in a sample chamber of an electron microscope (See Japanese Patent Application Publication No. Hei 6-44936).

On the other hand, the heating and observation of a solid sample has difficulty in fixing the solid sample directly to the coil heater because of the properties of the sample such as the shape thereof, and thus involves adopting a fixing method, such as molding the coil heater in any given shape to fix the sample on top of the molded heater or employing a double-heater construction to sandwich the sample in between the heaters, thereby carrying out the heating and observation (See Japanese Patent No. 3663056).

In addition, the heating and observation of a micro-sample subjected to micro-sampling (see Japanese Patent No. 2774884) involves fixing the micro-sample on a sample stage for use in an instrument for observation based on a focused ion beam process, what is called a notch mesh, and applying indirect heating to the sample, with the mesh contacted with the same molded heater as that for the solid sample, thereby carrying out the observation.

SUMMARY OF THE INVENTION

However, the conventional art encounters the actual situation where the amount of heat generated by the heater is almost entirely taken by the stage for mounting the heater, the mesh actually fixing the sample, or the like, and hence the amount of heat is not conducted throughout the sample to be actually heated.

Further, temperature measurements, when carried out on each of a series of these parts, have showed that the heater in itself reaches a very high temperature, whereas the sample has the lowest temperature. For this reason, even a further increase in the heater temperature does not effect the narrowing of a temperature differential between the heater temperature and the sample temperature, which in turn can interfere greatly with observation within the electron microscope due to the fact that an increase in the sample temperature requires an increase in the heater temperature.

In other words, a rise in the heater temperature can lead to gases originating from other members, thus causing the drifting of an image obtained by the electron microscope, and hence rendering the observation difficult.

An object of the present invention is to achieve a heating stage for a micro-sample, capable of efficient heating and accurate observation of the micro-sample.

The present invention provides a heating stage for a micro-sample, which supports the micro-sample for heating and observation of the micro-sample by any one of a transmission electron microscope and an ultra thin film evaluation instrument, including: a micro-sample mounting means for supporting the micro-sample, the means being made of a conductive material; and a heating stage base made of a conductive material, the base having a first supporting member that supports the micro-sample mounting means while having an electrical connection to one end of the micro-sample mounting means, and a second supporting member that supports the micro-sample mounting means while having an electrical connection to the other end of the micro-sample mounting means.

The present invention also provides a stage for a heating stage for a micro-sample, which fixes the heating stage for the micro-sample described above, for disposition in a sample fixing holder of any one of a transmission electron microscope and an ultra thin film evaluation instrument, including: two conducting metals on which the first and second supporting members of the heating stage base are disposed respectively while being separated from each other, the metals being made of a conductive material and having connections to conducting lead wires; and a fixing means for fixing the heating stage for the micro-sample, wherein an electron beam passage hole is formed between the conducting metals, the stage for the heating stage for the micro-sample is fixed to the sample fixing holder of any one of the transmission electron microscope and the ultra thin film evaluation instrument, and a current is fed through the conducting lead wires to the conducting metals, the first supporting member, the micro-sample mounting means, and the second supporting member to thereby heat the micro-sample mounting means and also heat the micro-sample.

The present invention also provides a sample fixing holder for a micro-sample, which supports the micro-sample for heating and observation of the micro-sample by any one of a transmission electron microscope and an ultra thin film evaluation instrument, including: a micro-sample mounting means for supporting the micro-sample, the means being disposed in an opening for passage of an electron beam and being made of a conductive material; a first supporting member made of a conductive material, which supports the micro-sample mounting means while having an electrical connection to one end of the micro-sample mounting means; and a second supporting member made of the conductive material, which supports the micro-sample mounting means while having an electrical connection to the other end of the micro-sample mounting means, wherein a current is fed through the first supporting member to the micro-sample mounting means and the second supporting member to thereby heat the micro-sample mounting means and also heat the micro-sample.

The present invention can achieve the heating stage for the micro-sample and the heating holder for the micro-sample, capable of efficient heating and accurate observation of the micro-sample.

DESCRIPTION OF THE PREFERRED EMBODIMENTS

Description will be given below with regard to embodiments of the present invention with reference to the accompanying drawings.

First Embodiment

Figure 1:
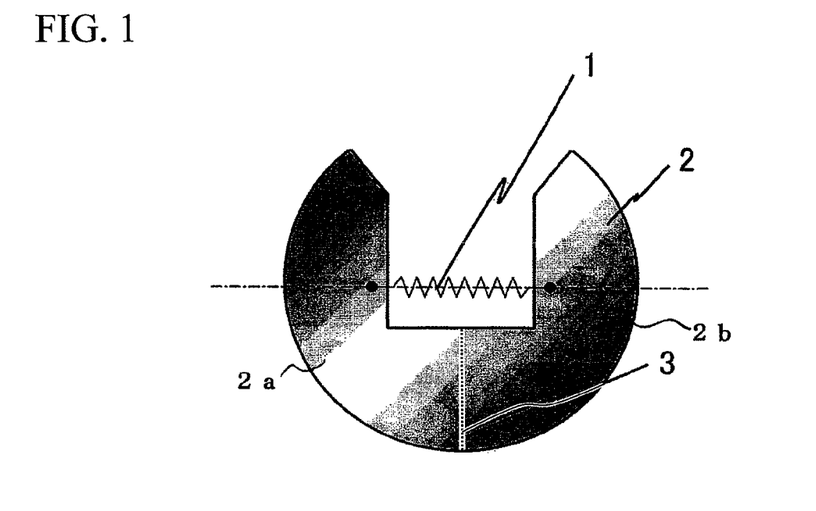
FIG. 1 is an explanatory view of a principal part of a heating stage for a micro-sample according to a first embodiment of the present invention.

FIG. 1 is a top view of a principal part of a heating stage for a micro-sample according to a first embodiment of the present invention. In FIG. 1, a micro-sample mount 1 is a heating portion in spiral form (or coil form), made of a very hard and high-melting point material such as tungsten or molybdenum. The micro-sample mount 1 is fixed at both ends to a base 2 for the heating stage for the micro-sample, made of a material such as molybdenum stainless steel.

Specifically, the base 2 can be divided into two semicircular supporting members 2a and 2b along a base cut line 3, and the micro-sample mount 1 is fixed at one end to the first supporting member 2a and is fixed at the other end to the second supporting member 2b. The supporting members 2a and 2b of the base 2, although integral with each other in their original positions, are configured so that they can be separated from each other along the base cut line (e.g., perforations) 3.

Figure 2A:
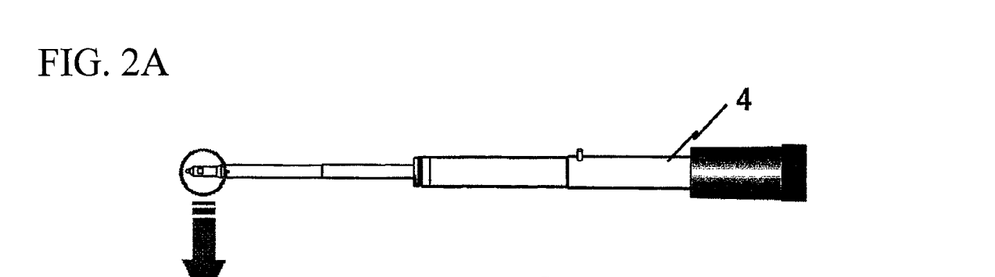
FIGS. 2A to 2C are explanatory views of the mounting of the micro-sample on the heating stage for the micro-sample according to the first embodiment of the present invention.
Figure 2B:
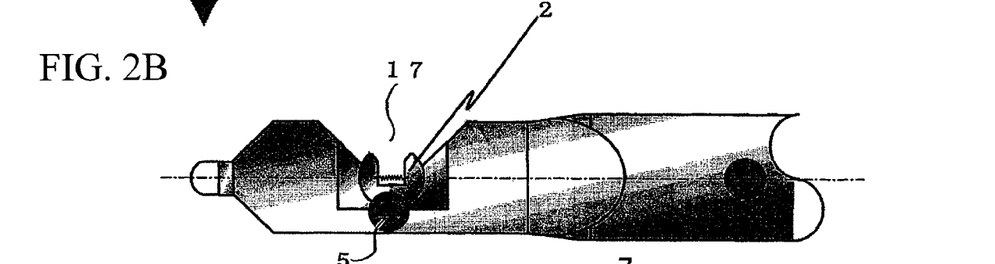

The base 2 for the heating stage for the micro-sample, in its FIG. 1 position, is attached as shown in FIG. 2B to the tip of a standard holder 4 for use in an instrument for observation based on a focused ion beam process, shown in FIG. 2A.

Specifically, the tip of the standard holder 4 is in plan configuration (incidentally, the direction of thickness corresponds to the direction from the front to the back of the sheet as seen in FIG. 2B), and the base 2 for the heating stage for the micro-sample is fastened in a notch 17 by a screw 5.

Figure 2C:
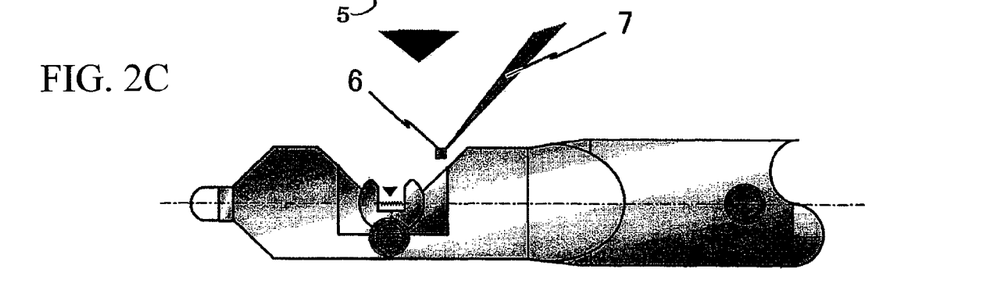

Then, as shown in FIG. 2C, a sample 6 subjected to micro-sampling by the instrument for observation based on the focused ion beam process (FIB) is mounted from the tip of a probe 7 onto the micro-sample mount 1.

Figure 3:
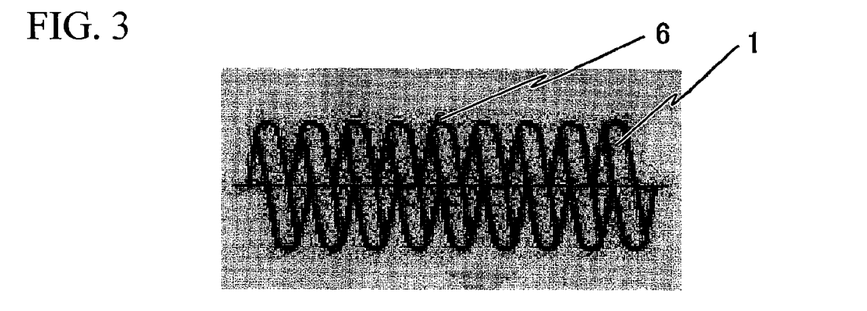
FIG. 3 is an enlarged view of a micro-sample mount according to the first embodiment of the present invention.

FIG. 3 is a view showing the mount 1 having the micro-sample 6 mounted thereon. The sample 6, as bonded to the probe 7, is fixed on the mount 1 by an adhesive (with a high melting point). After that, the probe 7 is cut off by the FIB, and the micro-sample 6 is fixed on the mount 1 as shown in FIG. 3.

Figure 4A:
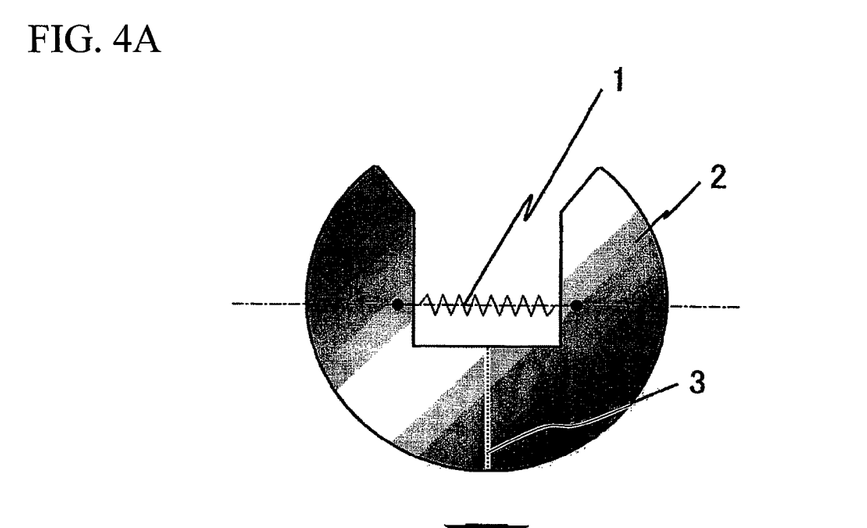
FIGS. 4A and 4B are explanatory views of the heating stage for the micro-sample according to the first embodiment of the present invention.
Figure 4B:
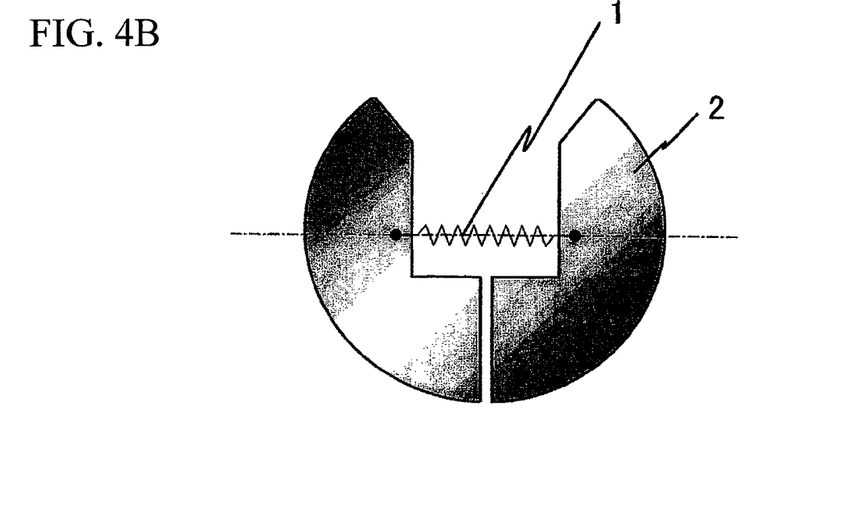

After that, the screw 5 is loosened to remove the base 2 for the heating stage for the micro-sample from the tip of the holder 4, and the base 2 is mounted on a stage for the sample stage to be described later. Then, as shown in FIG. 4B, the base 2 is divided into the members 2a and 2b, and a current is fed to the micro-sample mount 1 through the members 2a and 2b to thereby apply heat to the micro-sample 6.

Figure 5:
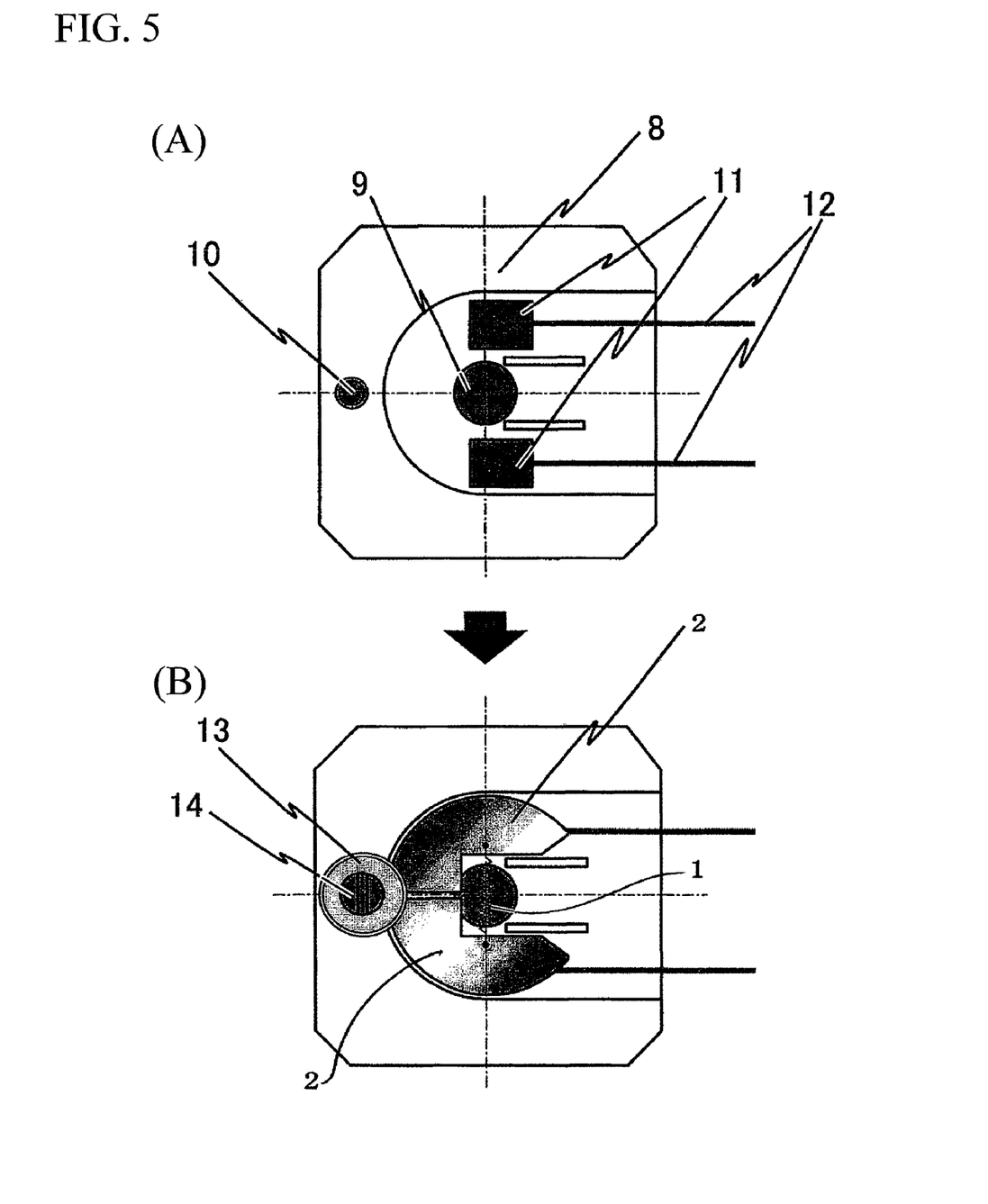
FIG. 5 is an explanatory view of a stage for the heating stage for the micro-sample according to the first embodiment of the present invention.

FIG. 5 is a view showing an example of the stage for the sample stage (made of a material having low thermal conductivity, such as ceramics), on which the base 2 for the heating stage for the micro-sample is mounted and the current is fed to the micro-sample mount 1.

In FIG. 5, two conducting metals 11 to form electrodes are fixed to a portion, of a stage 8 for the sample stage, for mounting the base 2 for the heating stage for the micro-sample, and an electron beam passage hole 9 is formed between the two conducting metals 11. Conducting lead wires 12 are connected to the conducting metals 11. Then, the base 2, with the members 2a and 2b separated from each other, is fixed through the insertion of a fixing screw 14 into a screw hole 10 with a washer 13 (made of a nonconductive material) in between.

At this point, the base 2 is fixed in such a manner that the micro-sample fixed on the micro-sample mount 1 mounting the micro-sample is in the center of the electron beam passage hole 9.

Figure 6:
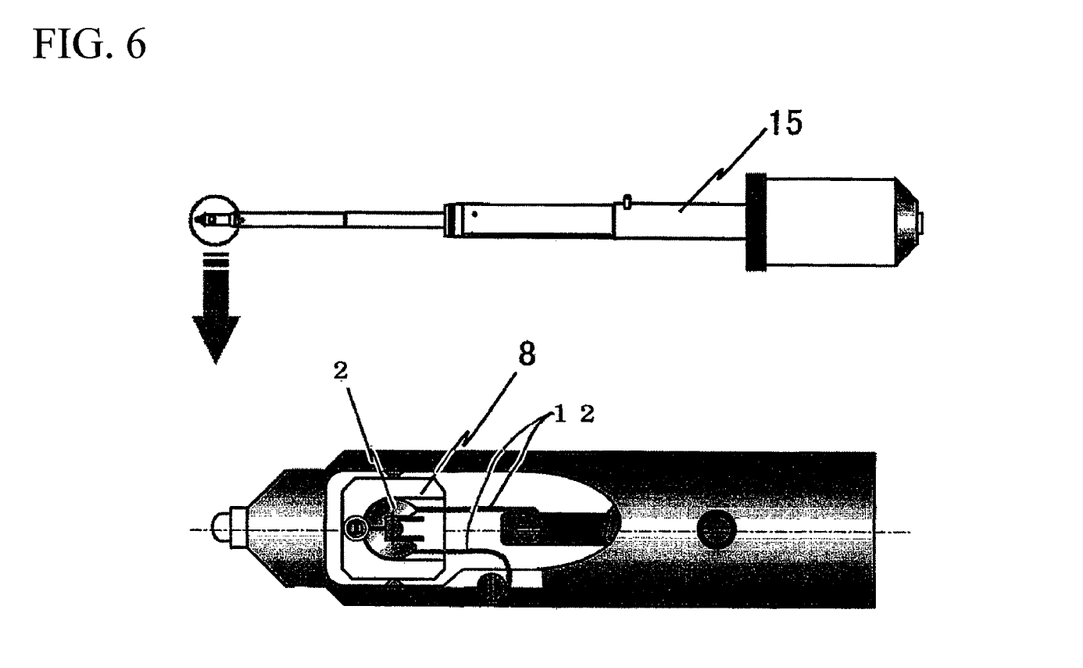
FIG. 6 is an explanatory view of mounting the stage for the heating stage for the micro-sample according to the first embodiment of the present invention on a heating holder for a transmission electron microscope or an ultra thin film evaluation instrument.

The fixing stage 8 for the sample stage, having the base 2 fixed thereon in this manner, is attached to a heating holder 15 for a transmission electron microscope (TEM) or an ultra thin film evaluation instrument (e.g., a scanning transmission electron microscope (STEM)) as shown in FIG. 6, the current is fed through the conducting lead wires 12 to the micro-sample mount 1 to thereby apply heat to the micro-sample 6, and the micro-sample 6 is observed as being heated.

Description will now be given with regard to temperature measurement that is made on the micro-sample. Although a radiation thermometer can be used for the temperature measurement, it is desirable that the temperature measurement take place with higher accuracy. In the first embodiment of the present invention, the temperature measurement may be effected by not only fixing the micro-sample 6 on the micro-sample mount 1 but also fixing the above-mentioned micro-sample with a known melting point in the vicinity of the micro-sample 6; and actually observing the state of the micro-sample with the known melting point. This enables accurate detection of the temperature of the micro-sample.

According to the first embodiment of the present invention, as described above, a configuration is such that the micro-sample is fixed directly on the micro-sample mount 1 that functions as a heater, and the micro-sample mount 1 with the micro-sample is heated, thereby making it possible to achieve the heating stage for the micro-sample, capable of direct transfer of heat generated by a heating means to the micro-sample, thus efficient heating of the micro-sample, and thus accurate observation of the micro-sample.

In the present invention, a heater unit that applies direct heating to the micro-sample subjected to a micro-sampling process besides a powder sample forms the sample mount.

Second Embodiment

Figure 7:
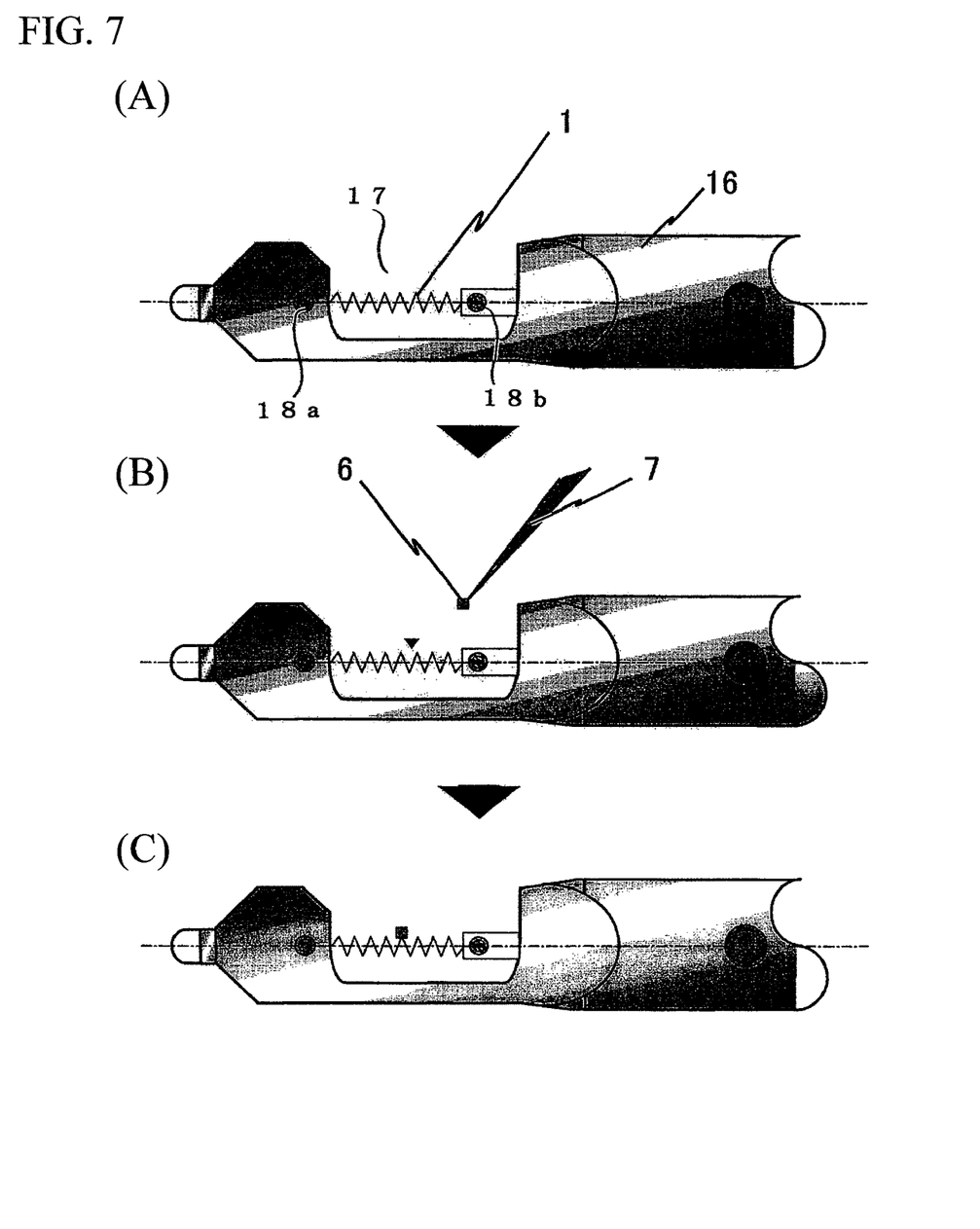
FIG. 7 is a view of the general configuration of a second embodiment of the present invention.

FIG. 7 is a view of the general configuration of a second embodiment of the present invention. The above-mentioned first embodiment has a configuration in which the stage 8 having the base 2 for the heating stage, mounting the micro-sample 6, is supported by the holder 15; however, the second embodiment has a configuration in which a micro-sample mount 1 is formed in an electron beam passage opening 17 formed at the tip of a holder 16 for common use in the instrument for observation based on the focused ion beam process and the transmission electron microscope or the ultra thin film evaluation instrument.

In FIG. 7, the micro-sample mount 1 for mounting a micro-sample 6 is a heating unit in spiral form made of a high-melting point material such as tungsten or molybdenum. The heating unit is fixed at both ends to the tip portion of the holder 16 made of a material such as stainless steel by first and second supporting members 18*a* and 18*b*.

After that, the sample subjected to the micro-sampling by the instrument for observation based on the focused ion beam process is first mounted on the mount 1. To mount the micro-sample, the holder 16 is provided with the opening formed in advance, which admits a micro-sample probe 7 of the instrument for observation based on the focused ion beam process.

After the mounting of the sample, the sample is observed as being heated, by the transmission electron microscope or the ultra thin film evaluation instrument, while being heated through the supply of the current to the mount 1.

The second embodiment can adopt a simple configuration to achieve the heating stage for the micro-sample, besides being able to achieve the same effect as the first embodiment.

Figure 8:
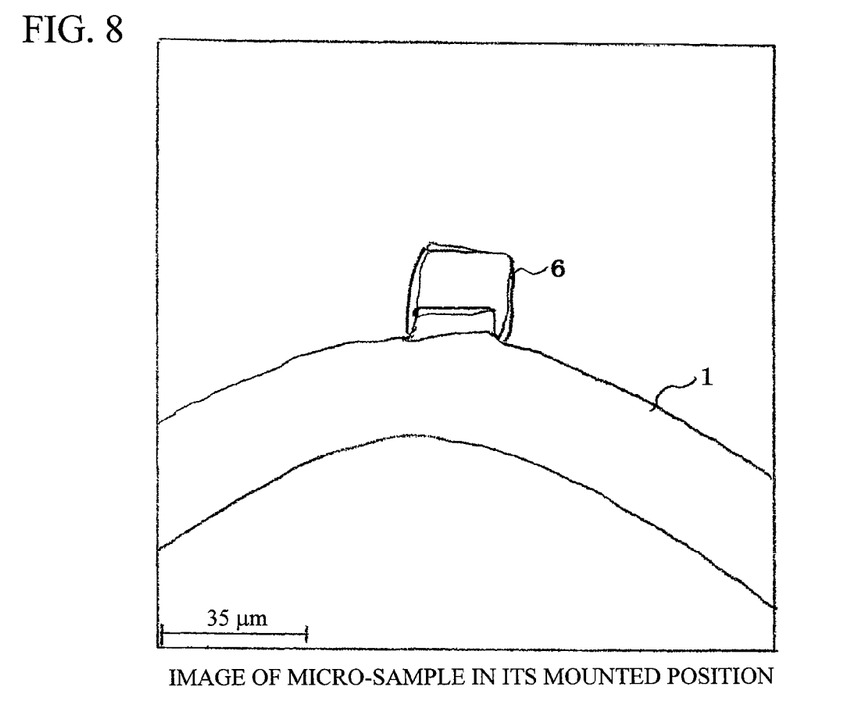
FIG. 8 is an explanatory view showing an image of the micro-sample in its mounted position, observed by an instrument for observation based on a focused ion beam process.

FIG. 8 is a view showing the mount 1 as mounting the micro-sample 6. The micro-sample 6 is fixed on the mount 1, as shown in FIG. 8.

FIGS. 9 to 13 are explanatory views of an instance where the micro-sample made of molybdenum (Mo) and tantalum (Ta) was observed as being in process of being heated, by the ultra thin film evaluation instrument, using one embodiment of the present invention.

Figure 9:
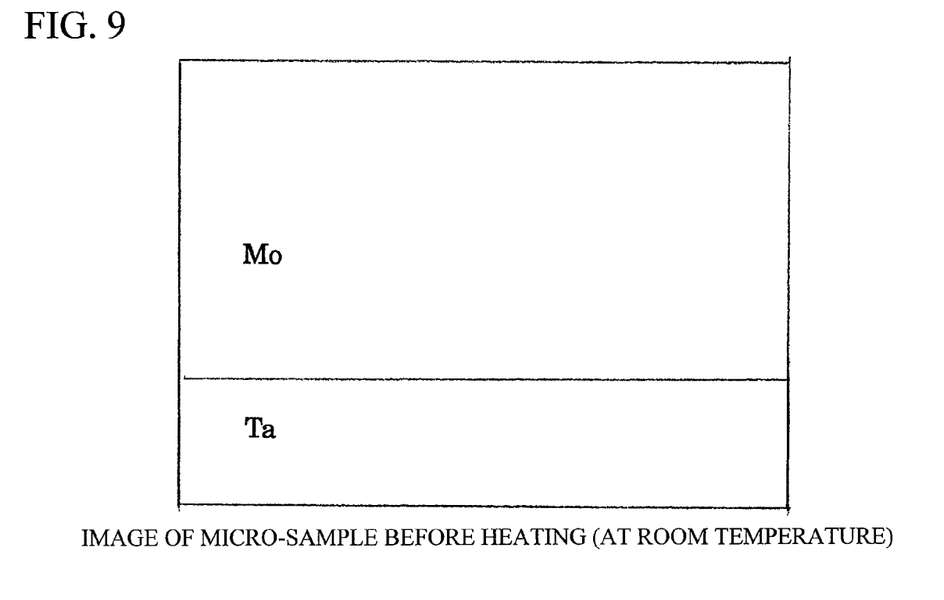
FIG. 9 is a view showing an instance where the micro-sample made of molybdenum and tantalum was observed as being in process of being heated by use of the present invention (at room temperature).
Figure 10:
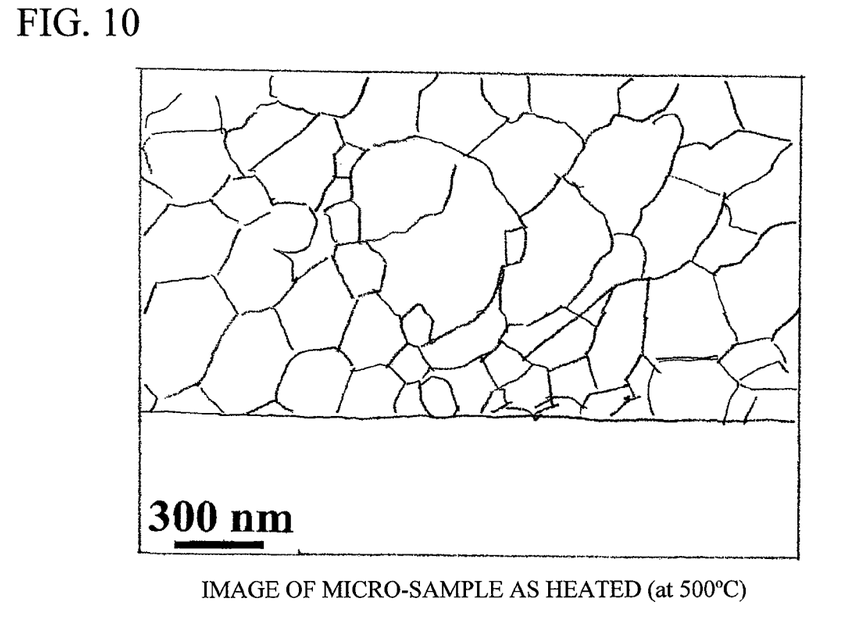
FIG. 10 is a view showing an instance where the micro-sample made of the molybdenum and the tantalum was observed as being in process of being heated by use of the present invention (at 500° C.).
Figure 11:
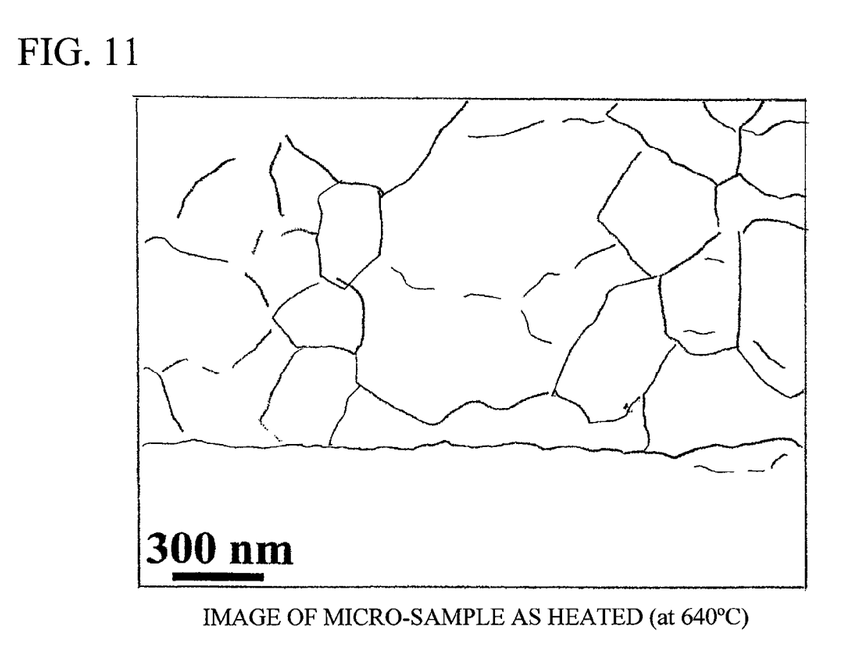
FIG. 11 is a view showing an instance where the micro-sample made of the molybdenum and the tantalum was observed as being in process of being heated by use of the present invention (at 640° C.).
Figure 12:
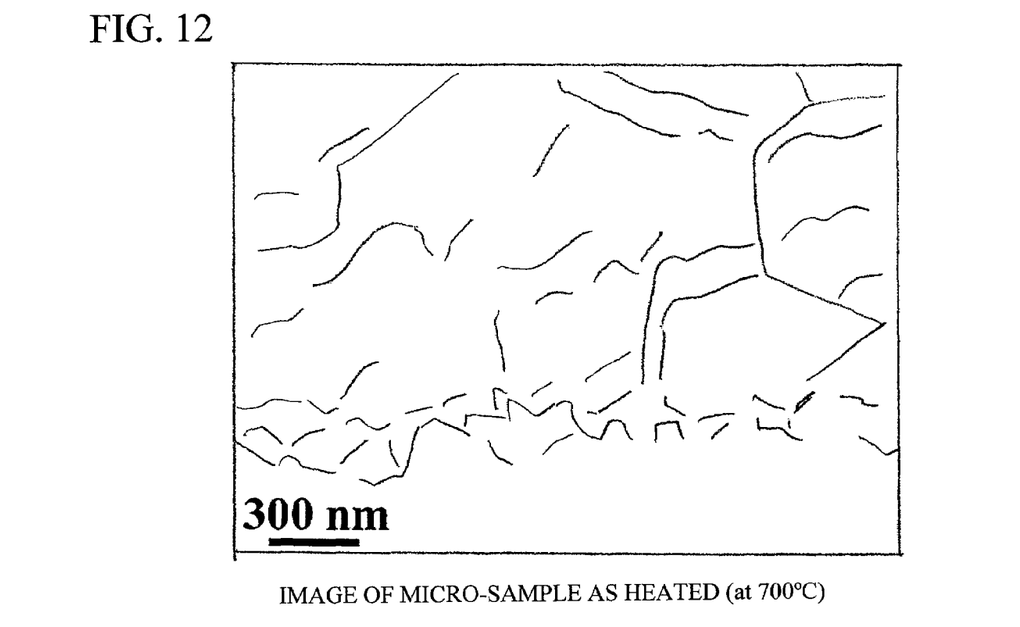
FIG. 12 is a view showing an instance where the micro-sample made of the molybdenum and the tantalum was observed as being in process of being heated by use of the present invention (at 700° C.).
Figure 13:
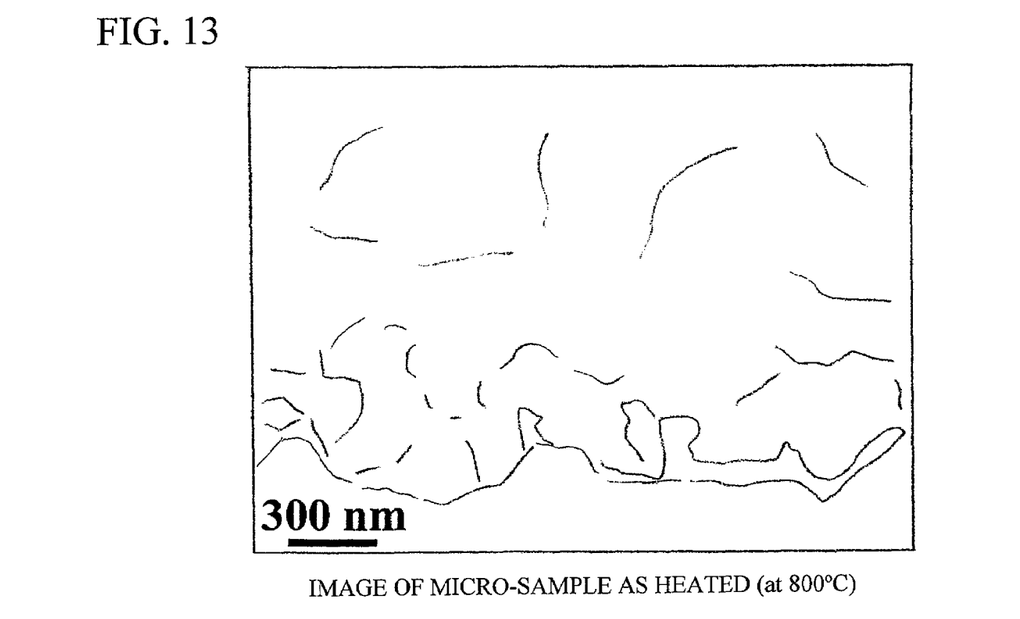
FIG. 13 is a view showing an instance where the micro-sample made of the molybdenum and the tantalum was observed as being in process of being heated by use of the present invention (at 800° C.).

As shown in FIG. 9, the molybdenum and the tantalum are clearly separate from each other at room temperature. It has been observed that as a heating temperature rises in turn from 500° C. to 640° C., 700° C., and 800° C., crystallization takes place to form a crystals, which then become larger, and, when the temperature reaches 800 degrees ° C., a complete reaction occurs to yield a compound of the molybdenum and the tantalum.

The present invention is the first to enable obtaining the relationship between the temperature of the micro-sample and the molten state of the micro-sample in process of being heated as mentioned above.

In other words, the conventional art has difficulty in applying direct heating to the micro-sample, thus employs indirect heating, and thus has difficulty in performing an accurate measurement of the temperature of the micro-sample. Thus, the conventional art cannot clearly grasp the relationship between the temperature and the molten state of the micro-sample of the micro-sample in process of being heated.

The present invention enables the direct heating of the micro-sample, thereby enabling accurate detection of a rise in the temperature of the micro-sample, for example based on the relationship between the current fed to the mount 1 and the temperature, or the like.

EXPLANATION OF REFERENCE NUMERALS

1 . . . micro-sample mount, 2 . . . base for heating stage for micro-sample, 3 . . . base cut line, 4 . . . standard holder for instrument for observation based on focused ion beam process, 5 and 14 . . . screws, 6 . . . micro-sample, 7 . . . micro-sample probe, 8 . . . stage for heating stage for micro-sample, 9 . . . electron beam passage hole, 10 . . . screw hole, 11 . . . conducting metal, 12 . . . conducting lead wire, 13 . . . fixing washer for heating stage for micro-sample, 15 . . . heating holder for transmission electron microscope or ultra thin film evaluation instrument, 16 . . . heating holder for micro-sample, 17 . . . notch, 18*a* . . . first supporting member, 18*b* . . . second supporting member

What is claimed is:

1. A heating stage for a micro-sample, which supports the micro-sample for heating and observation of the micro-sample by any one of a transmission electron microscope and an ultra thin film evaluation instrument, comprising:

a micro-sample mounting means for supporting the micro-sample, the means being made of a conductive material; and a heating stage base made of a conductive material, the base having a first supporting member that supports the micro-sample mounting means while having an electrical connection to one end of the micro-sample mounting means, and a second supporting member that supports the micro-sample mounting means while having an electrical connection to the other end of the micro-sample mounting means.

2. The heating stage for the micro-sample according to claim 1, wherein the heating stage base has a cut line formed therein for separating the first supporting member and the second supporting member from each other, so that the first supporting member and the second supporting member that are integral with each other can be separated from each other along the cut line.

3. The heating stage for the micro-sample according to claim 1, wherein the micro-sample is placed on the micro-sample mounting means by use of a probe that supports the micro-sample at the tip, the micro-sample is fixed by an adhesive, and the probe and the micro-sample are cut off by a focused ion beam.

4. The heating stage for the micro-sample according to claim 3, wherein the micro-sample is fixed on the micro-sample mounting means by the adhesive.

5. The heating stage for the micro-sample according to claim 3, wherein a micro-material with a known melting point is fixed on the micro-sample mounting means in the vicinity of the fixed micro-sample.

6. A stage for a heating stage for a micro-sample, which fixes the heating stage for the micro-sample according to claim 1, for disposition in a sample fixing holder of any one of a transmission electron microscope and an ultra thin film evaluation instrument, comprising:

two conducting metals on which the first and second supporting members of the heating stage base are disposed respectively while being separated from each other, the metals being made of a conductive material and having connections to conducting lead wires; and a fixing means for fixing the heating stage for the micro-sample, wherein an electron beam passage hole is formed between the conducting metals, the stage for the heating stage for the micro-sample is fixed to the sample fixing holder of any one of the transmission electron microscope and the ultra thin film evaluation instrument, and a current is fed through the conducting lead wires to the conducting metals, the first supporting member, the micro-sample mounting means, and the second supporting member to thereby heat the micro-sample mounting means and also heat the micro-sample.

7. A sample fixing holder for a micro-sample, which supports the micro-sample for heating and observation of the micro-sample by any one of a transmission electron microscope and an ultra thin film evaluation instrument, comprising:

a micro-sample mounting means for supporting the micro-sample, the means being disposed in an opening for passage of an electron beam and being made of a conductive material;

a first supporting member made of a conductive material, which supports the micro-sample mounting means while having an electrical connection to one end of the micro-sample mounting means; and a second supporting member made of the conductive material, which supports the micro-sample mounting means while having an electrical connection to the other end of the micro-sample mounting means, wherein a current is fed through the first supporting member to the micro-sample mounting means and the second supporting member to thereby heat the micro-sample mounting means and also heat the micro-sample.

8. A heating stage for a micro-sample, which supports the micro-sample for heating and observation of the micro-sample by any one of a transmission electron microscope and an ultra thin film evaluation instrument, comprising:

a micro-sample mount for supporting the micro-sample, the mount being made of a conductive material; and a heating stage base made of a conductive material, the base having a first supporting member that supports the micro-sample mount while having an electrical connection to one end of the micro-sample mount, and a second supporting member that supports the micro-sample mount while having an electrical connection to the other end of the micro-sample mount.

9. The heating stage for the micro-sample according to claim 1, wherein the heating stage base has a cut line formed therein for separating the first supporting member and the second supporting member from each other, so that the first supporting member and the second supporting member that are integral with each other can be separated from each other along the cut line.

10. The heating stage for the micro-sample according to claim 1, wherein the micro-sample is placed on the micro-sample mount by use of a probe that supports the micro-sample at the tip, the micro-sample is fixed by an adhesive, and the probe and the micro-sample are cut off by a focused ion beam.

11. The heating stage for the micro-sample according to claim 3, wherein the micro-sample is fixed on the micro-sample mount by the adhesive.

12. The heating stage for the micro-sample according to claim 3, wherein a micro-material with a known melting point is fixed on the micro-sample mount in the vicinity of the fixed micro-sample.

13. A stage for a heating stage for a micro-sample, which fixes the heating stage for the micro-sample according to claim 1, for disposition in a sample fixing holder of any one of a transmission electron microscope and an ultra thin film evaluation instrument, comprising:

two conducting metals on which the first and second supporting members of the heating stage base are disposed respectively while being separated from each other, the metals being made of a conductive material and having connections to conducting lead wires; and a fixing components for fixing the heating stage for the micro-sample, wherein an electron beam passage hole is formed between the conducting metals, the stage for the heating stage for the micro-sample is fixed to the sample fixing holder of any one of the transmission electron microscope and the ultra thin film evaluation instrument, and a current is fed through the conducting lead wires to the conducting metals, the first supporting member, the micro-sample mount, and the second supporting member to thereby heat the micro-sample mount and also heat the micro-sample.

14. A sample fixing holder for a micro-sample, which supports the micro-sample for heating and observation of the micro-sample by any one of a transmission electron microscope and an ultra thin film evaluation instrument, comprising:

a micro-sample mount for supporting the micro-sample, the mount being disposed in an opening for passage of an electron beam and being made of a conductive material;

a first supporting member made of a conductive material, which supports the micro-sample mount while having an electrical connection to one end of the micro-sample mount; and a second supporting member made of the conductive material, which supports the micro-sample mount while having an electrical connection to the other end of the micro-sample mount, wherein a current is fed through the first supporting member to the micro-sample mount and the second supporting member to thereby heat the micro-sample mount and also heat the micro-sample.

* * * * *

UNITED STATES PATENT AND TRADEMARK OFFICE
CERTIFICATE OF CORRECTION

PATENT NO. : 7,700,927 B2  Page 1 of 1
APPLICATION NO. : 12/123168
DATED : April 20, 2010
INVENTOR(S) : Yasuhira Nagakubo et al.

It is certified that error appears in the above-identified patent and that said Letters Patent is hereby corrected as shown below:

On the title page

Item "(75) Inventors: Yasuhira Nagakubo, Hitahinaka (JP); Toshiaki Tanigaki, Hitahinaka (JP); Katsuji Itou, Hitahinaka (JP); Takashi Kanemura, Hitahinaka (JP); Takayuki Asakawa, Hitahinaka (JP)", should be changed to --(75) Inventors: Yasuhira Nagakubo, Hitachinaka (JP); Toshiaki Tanigaki, Hitachinaka (JP); Katsuji Itou, Hitachinaka (JP); Takashi Kanemura, Hitachinaka (JP); Takayuki Asakawa, Hitachinaka (JP)--

Signed and Sealed this

Twenty-third Day of November, 2010

David J. Kappos
*Director of the United States Patent and Trademark Office*